(12) United States Patent
Bryan et al.

(10) Patent No.: US 11,524,582 B2
(45) Date of Patent: Dec. 13, 2022

(54) BATTERY CHARGING SYSTEM FOR HYBRID OR ELECTRIC VEHICLE

(71) Applicant: FORD GLOBAL TECHNOLOGIES, LLC, Dearborn, MI (US)

(72) Inventors: Seth Anthony Bryan, Royal Oak, MI (US); William David Treharne, Ypsilanti, MI (US); Fazal Urrahman Syed, Canton, MI (US); Garrett Carlson, Dearborn, MI (US); Douglas Michael Smith, Ypsilanti, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 9 days.

(21) Appl. No.: 17/176,739

(22) Filed: Feb. 16, 2021

(65) Prior Publication Data

US 2022/0258609 A1    Aug. 18, 2022

(51) Int. Cl.

| | |
|---|---|
| *B60L 1/00* | (2006.01) |
| *B60L 50/50* | (2019.01) |
| *B60W 20/13* | (2016.01) |
| *G01R 31/392* | (2019.01) |
| *H02J 7/14* | (2006.01) |
| *B60L 58/12* | (2019.01) |

(52) U.S. Cl.
CPC ............... *B60L 1/006* (2013.01); *B60L 50/50* (2019.02); *B60L 58/12* (2019.02); *B60W 20/13* (2016.01); *G01R 31/392* (2019.01); *H02J 7/14* (2013.01)

(58) Field of Classification Search
CPC .......... B60L 1/006; B60L 50/50; B60L 58/12; B60W 20/13; G01R 31/392; H02J 7/14
USPC ....................................................... 307/10.1
See application file for complete search history.

(56) References Cited

U.S. PATENT DOCUMENTS

| | | | |
|---|---|---|---|
| 2015/0084411 A1 | 3/2015 | Cho et al. | |
| 2020/0055473 A1 | 2/2020 | Ferrel et al. | |
| 2021/0313816 A1* | 10/2021 | Yamagami | ............... B60L 58/16 |
| 2022/0080945 A1* | 3/2022 | Han | ........................ B60L 50/61 |

* cited by examiner

*Primary Examiner* — Toan T Vu
*Assistant Examiner* — Dru Parries
(74) *Attorney, Agent, or Firm* — David B Kelley; Brooks Kushman P.C.

(57) ABSTRACT

A vehicle includes a battery, an electric machine, an electrical outlet, and a controller. The electric machine is configured to charge the battery. The electrical outlet is configured to draw power from the battery to power an external device. The controller is programmed to adjust a rate at which the electric machine charges the battery based on a power consumption at the electrical outlet exceeding a threshold and a battery degradation value.

20 Claims, 3 Drawing Sheets

BATTERY CHARGING SYSTEM FOR HYBRID OR ELECTRIC VEHICLE

TECHNICAL FIELD

The present disclosure relates to vehicles having electrical outlets that provide power to one or more external devices when the external devices are plugged into the outlets.

BACKGROUND

Electrical outlets are configured to provide power to an external device when the external device is plugged into the outlet.

SUMMARY

A vehicle includes a battery, an electric machine, an electrical outlet, and a controller. The electric machine is configured to charge the battery. The electrical outlet is configured to draw power from the battery to power an external device. The controller is programmed to adjust a rate at which the electric machine charges the battery based on a power consumption at the electrical outlet exceeding a threshold and a battery degradation value.

A vehicle includes a battery, an electric machine, an electrical circuit, an electrical outlet, and a controller. The electric machine is configured to propel the vehicle and to charge the battery. The electrical circuit is configured to transfer power between the battery and the electric machine. The electrical outlet is configured to draw power from the battery via the electrical circuit. The controller is programmed to, in response to a battery charge decreasing to less than a charge threshold, issue a command to charge the battery. The controller is further programmed to, in response to the command to charge the battery, a power consumption at the electrical outlet exceeding a consumption threshold, and parameter values indicative of a decrease in an energy storage capacity of the battery, decrease a rate at which the electric machine charges the battery from a base value to an adjusted value.

A vehicle includes a battery, an electric machine, an engine, an electrical outlet, and a controller. The electric machine is configured to charge the battery. The engine is configured to power the electric machine to charge the battery. The electrical outlet is configured to draw power from the battery to power an external device. The controller is programmed to, in response to a power consumption at the electrical outlet exceeding a threshold and an increase in a battery degradation value, adjust a power output of the engine to decrease a rate at which the electric machine charges the battery.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
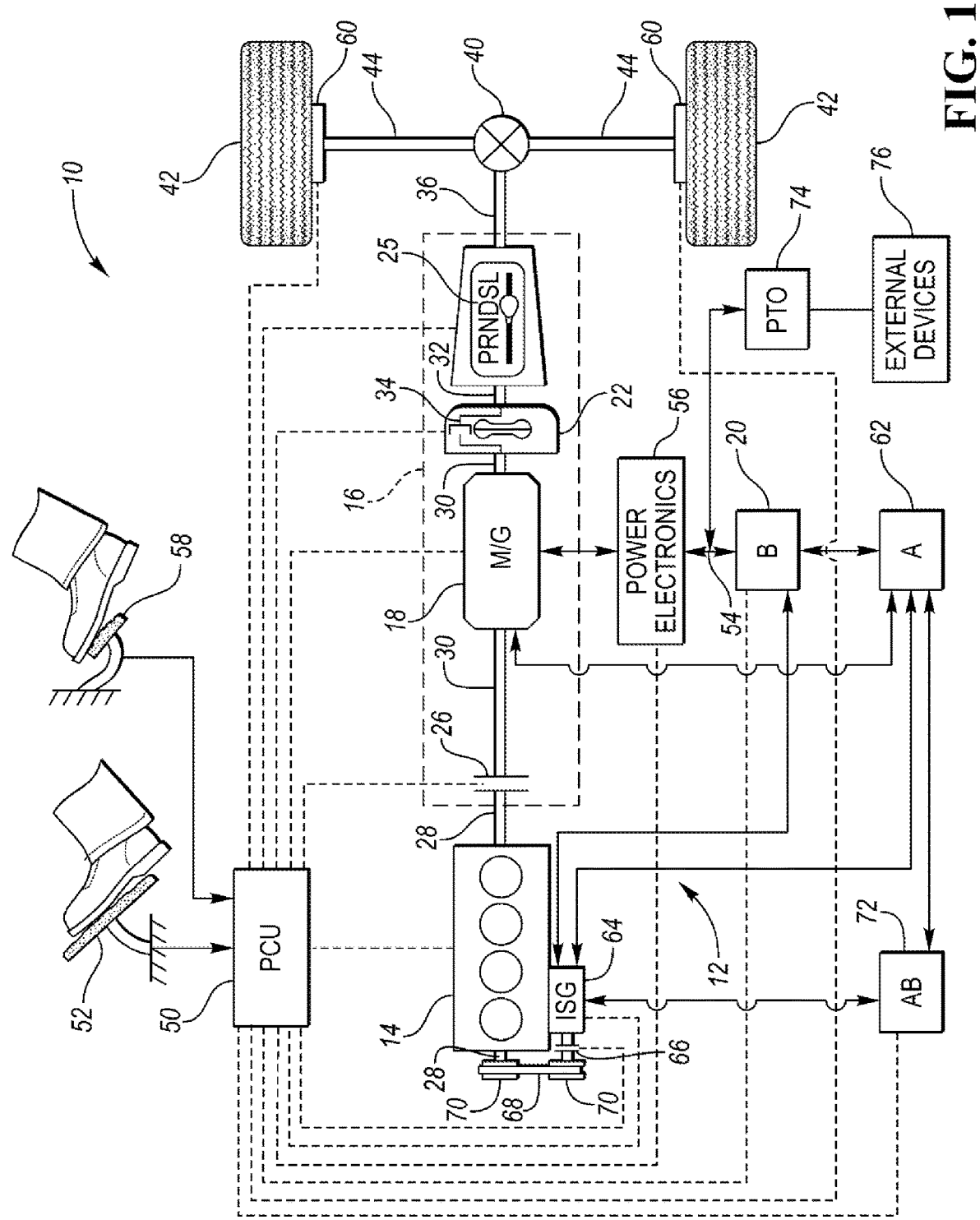
FIG. 1 is a schematic illustration of an exemplary powertrain of a hybrid electric vehicle.

Referring to FIG. 1, a schematic diagram of a hybrid electric vehicle (HEV) 10 is illustrated according to an embodiment of the present disclosure. FIG. 1 illustrates representative relationships among the components. Physical placement and orientation of the components within the vehicle may vary. The HEV 10 includes a powertrain 12. The powertrain 12 includes an engine 14 that drives a transmission 16, which may be referred to as a modular hybrid transmission (WIT). As will be described in further detail below, transmission 16 includes an electric machine such as an electric motor/generator (M/G) 18, an associated traction battery 20, a torque converter 22, and a multiple step-ratio automatic transmission, or gearbox 24. The transmission, or gearbox 24, may be placed in PRNDSL (park, reverse, neutral, drive, sport, low) via a transmission range or gear selector 25.

The engine 14 and the M/G 18 are both drive sources for the HEV 10 that are configured to propel the REV 10. The engine 14 generally represents a power source that may include an internal combustion engine such as a gasoline, diesel, or natural gas powered engine, or a fuel cell. The engine 14 generates an engine power and corresponding engine torque that is supplied to the M/G 18 when a disconnect clutch 26 between the engine 14 and the M/G 18 is at least partially engaged. The M/G 18 may be implemented by any one of a plurality of types of electric machines. For example, M/G 18 may be a permanent magnet synchronous motor. Power electronics condition direct current (DC) power provided by the battery 20 to the requirements of the M/G 18, as will be described below. For example, power electronics may provide three phase alternating current (AC) to the M/G 18.

When the disconnect clutch 26 is at least partially engaged, power flow from the engine 14 to the M/G 18 or from the M/G 18 to the engine 14 is possible. For example, the disconnect clutch 26 may be engaged and M/G 18 may operate as a generator to convert rotational energy provided by a crankshaft 28 and M/G shaft 30 into electrical energy to be stored in the battery 20. The disconnect clutch 26 can also be disengaged to isolate the engine 14 from the remainder of the powertrain 12 such that the M/G 18 can act as the sole drive source for the HEV 10. Shaft 30 extends through the M/G 18. The M/G 18 is continuously drivably connected to the shaft 30, whereas the engine 14 is drivably connected to the shaft 30 only when the disconnect clutch 26 is at least partially engaged.

The M/G 18 is connected to the torque converter 22 via shaft 30. The torque converter 22 is therefore connected to the engine 14 when the disconnect clutch 26 is at least partially engaged. The torque converter 22 includes an impeller fixed to M/G shaft 30 and a turbine fixed to a transmission input shaft 32. The torque converter 22 thus provides a hydraulic coupling between shaft 30 and transmission input shaft 32. The torque converter 22 transmits power from the impeller to the turbine when the impeller rotates faster than the turbine. The magnitude of the turbine torque and impeller torque generally depend upon the relative speeds. When the ratio of impeller speed to turbine speed is sufficiently high, the turbine torque is a multiple of the impeller torque. A torque converter bypass clutch (also known as a torque converter lock-up clutch) 34 may also be provided that, when engaged, frictionally or mechanically couples the impeller and the turbine of the torque converter 22, permitting more efficient power transfer. The torque converter bypass clutch 34 may be operated as a launch clutch to provide smooth vehicle launch. Alternatively, or in combination, a launch clutch similar to disconnect clutch 26 may be provided between the M/G 18 and gearbox 24 for applications that do not include a torque converter 22 or a torque converter bypass clutch 34. In some applications, disconnect clutch 26 is generally referred to as an upstream clutch and launch clutch 34 (which may be a torque converter bypass clutch) is generally referred to as a downstream clutch.

The gearbox 24 may include gear sets (not shown) that are selectively placed in different gear ratios by selective engagement of friction elements such as clutches and brakes (not shown) to establish the desired multiple discrete or step drive ratios. The friction elements are controllable through a shift schedule that connects and disconnects certain elements of the gear sets to control the ratio between a transmission output shaft 36 and the transmission input shaft 32. The gearbox 24 is automatically shifted from one ratio to another based on various vehicle and ambient operating conditions by an associated controller, such as a powertrain control unit (PCU). Power and torque from both the engine 14 and the M/G 18 may be delivered to and received by gearbox 24. The gearbox 24 then provides powertrain output power and torque to output shaft 36.

It should be understood that the hydraulically controlled gearbox 24 used with a torque converter 22 is but one example of a gearbox or transmission arrangement; any multiple ratio gearbox that accepts input torque(s) from an engine and/or a motor and then provides torque to an output shaft at the different ratios is acceptable for use with embodiments of the present disclosure. For example, gearbox 24 may be implemented by an automated mechanical (or manual) transmission (AMT) that includes one or more servo motors to translate/rotate shift forks along a shift rail to select a desired gear ratio. As generally understood by those of ordinary skill in the art, an AMT may be used in applications with higher torque requirements, for example.

As shown in the representative embodiment of FIG. 1, the output shaft 36 is connected to a differential 40. The differential 40 drives a pair of wheels 42 via respective axles 44 connected to the differential 40. The differential transmits approximately equal torque to each wheel 42 while permitting slight speed differences such as when the vehicle turns a corner. Different types of differentials or similar devices may be used to distribute torque from the powertrain to one or more wheels. In some applications, torque distribution may vary depending on the particular operating mode or condition, for example.

The powertrain 12 further includes an associated controller 50 such as a powertrain control unit (PCU). While illustrated as one controller, the controller 50 may be part of a larger control system and may be controlled by various other controllers throughout the vehicle 10, such as a vehicle system controller (VSC). It should therefore be understood that the powertrain control unit 50 and one or more other controllers can collectively be referred to as a "controller" that controls various actuators in response to signals from various sensors to control functions such as starting/stopping engine 14, operating M/G 18 to provide wheel torque or charge battery 20, select or schedule transmission shifts, etc. Controller 50 may include a microprocessor or central processing unit (CPU) in communication with various types of computer readable storage devices or media. Computer readable storage devices or media may include volatile and nonvolatile storage in read-only memory (ROM), random-access memory (RAM), and keep-alive memory (KAM), for example. KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller in controlling the engine or vehicle.

The controller communicates with various engine/vehicle sensors and actuators via an input/output (I/O) interface (including input and output channels) that may be implemented as a single integrated interface that provides various raw data or signal conditioning, processing, and/or conversion, short-circuit protection, and the like. Alternatively, one or more dedicated hardware or firmware chips may be used to condition and process particular signals before being supplied to the CPU. As generally illustrated in the representative embodiment of FIG. 1, controller 50 may communicate signals to and/or from engine 14, disconnect clutch 26, M/G 18, battery 20, launch clutch 34, transmission gearbox 24, and power electronics 56. Although not explicitly illustrated, those of ordinary skill in the art will recognize various functions or components that may be controlled by controller 50 within each of the subsystems identified above. Representative examples of parameters, systems, and/or components that may be directly or indirectly actuated using control logic and/or algorithms executed by the controller include fuel injection timing, rate, and duration, throttle valve position, spark plug ignition timing (for spark-ignition engines), intake/exhaust valve timing and duration, front-end accessory drive (FEAD) components such as an alternator, air conditioning compressor, battery charging or discharging (including determining the maximum charge and discharge power limits), regenerative braking, M/G operation, clutch pressures for disconnect clutch 26, launch clutch 34, and transmission gearbox 24, and the like. Sensors communicating input through the I/O interface may be used to indicate turbocharger boost pressure, crankshaft position (PIP), engine rotational speed (RPM), wheel speeds (WS1, WS2), vehicle speed (VSS), coolant temperature (ECT), intake manifold pressure (MAP), accelerator pedal position (PPS), ignition switch position (IGN), throttle valve position (TP), air temperature (TMP), exhaust gas oxygen (EGO) or other exhaust gas component concentration or presence, intake air flow (MAF), transmission gear, ratio, or mode, transmission oil temperature (TOT), transmission turbine speed (TS), torque converter bypass clutch 34 status (TCC), deceleration or shift mode (MDE), battery temperature, voltage, current, or state of charge (SOC) for example.

Control logic or functions performed by controller 50 may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but is provided for ease of illustration and description. The control logic may be implemented primarily in software executed by a microprocessor-based vehicle, engine, and/or powertrain controller, such as controller 50. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

An accelerator pedal 52 is used by the driver of the vehicle to provide a demanded torque, power, or drive command to propel the vehicle. In general, depressing and releasing the accelerator pedal 52 generates an accelerator pedal position signal that may be interpreted by the controller 50 as a demand for increased power or decreased power, respectively. A brake pedal 58 is also used by the driver of the vehicle to provide a demanded braking torque to slow the vehicle. In general, depressing and releasing the brake pedal 58 generates a brake pedal position signal that may be interpreted by the controller 50 as a demand to decrease the vehicle speed. Based upon inputs from the accelerator pedal 52 and brake pedal 58, the controller 50 commands the torque to the engine 14, M/G 18, and friction brakes 60. The controller 50 also controls the timing of gear shifts within the gearbox 24, as well as engagement or disengagement of the disconnect clutch 26 and the torque converter bypass clutch 34. Like the disconnect clutch 26, the torque converter bypass clutch 34 can be modulated across a range between the engaged and disengaged positions. This produces a variable slip in the torque converter 22 in addition to the variable slip produced by the hydrodynamic coupling between the impeller and the turbine. Alternatively, the torque converter bypass clutch 34 may be operated as locked or open without using a modulated operating mode depending on the particular application.

To drive the vehicle with the engine 14, the disconnect clutch 26 is at least partially engaged to transfer at least a portion of the engine torque through the disconnect clutch 26 to the M/G 18, and then from the M/G 18 through the torque converter 22 and gearbox 24. The M/G 18 may assist the engine 14 by providing additional power to turn the shaft 30. This operation mode may be referred to as a "hybrid mode" or an "electric assist mode."

To drive the vehicle with the M/G 18 as the sole power source, the power flow remains the same except the disconnect clutch 26 isolates the engine 14 from the remainder of the powertrain 12. Combustion in the engine 14 may be disabled or otherwise OFF during this time to conserve fuel. The traction battery 20 transmits stored electrical energy through wiring 54 to power electronics 56 that may include an inverter, for example. The power electronics 56 convert DC voltage from the battery 20 into AC voltage to be used by the M/G 18. The controller 50 commands the power electronics 56 to convert voltage from the battery 20 to an AC voltage provided to the M/G 18 to provide positive or negative torque to the shaft 30. This operation mode may be referred to as an "electric only" or "EV" operation mode.

In any mode of operation, the M/G 18 may act as a motor and provide a driving force for the powertrain 12. To drive the vehicle with the M/G 18 the traction battery 20 transmits stored electrical energy through wiring 54 to the power electronics 56 that may include inverter and rectifier circuitry, for example. The inverter circuitry of the power electronics 56 may convert DC voltage from the battery 20 into AC voltage to be used by the M/G 18. The rectifier circuitry of the power electronics 56 may convert AC voltage from the M/G 18 into DC voltage to be stored with the battery 20. The controller 50 commands the power electronics 56 to convert voltage from the battery 20 to an AC voltage provided to the M/G 18 to provide positive or negative torque to shaft 30. Inverter circuitry and rectifier circuitry are disclosed in U.S. patent application Ser. No. 16/189,713, filed on Nov. 13, 2018, which is incorporated by reference herein in its entirety.

Alternatively, the M/G 18 may act as a generator and convert kinetic energy from the powertrain 12 into electric energy to be stored in the battery 20. The M/G 18 may act as a generator while the engine 14 is providing propulsion power for the vehicle 10, for example. The M/G 18 may additionally act as a generator during times of regenerative braking in which torque and rotational (or motive) energy or power from spinning wheels 42 is transferred back through the gearbox 24, torque converter 22, (and/or torque converter bypass clutch 34) and is converted into electrical energy for storage in the battery 20.

The battery 20 and/or the M/G 18 may also be configured to provide electrical power to one or more vehicle accessories 62. The vehicle accessories 62 may include, but are not limited to, climate control systems (including heating and cooling systems for the cabin interior of the vehicle or heating and cooling system for vehicle components, such as a chiller to cool the battery 20), power steering systems, radios, control interfaces (e.g., a human machine interface or user interface), various controllers, entertainment systems (e.g., monitors, DVD players, etc.), electric heaters, or any other system or device that is electrically operated. Some of the accessories 62 may directly draw electrical power from the battery 20, an accessory battery 72, and/or the M/G 18, while some of the accessories 62 may draw electrical power from the battery 20, the accessory battery 72, and/or the M/G 18 via an inverting circuitry, rectifying circuitry, or a DC to DC converter. For example, a DC to DC converter may be disposed between the battery 20 and one or more of the accessories 62.

An integrated starter-generator (ISG) 64 may be coupled to the engine 14 (i.e., may be coupled to the crankshaft 28 of the engine 14). The ISG 64 may be configured to operate as a motor to start the engine 14 during an engine start-up event, or to provide additional torque to the powertrain 12 during vehicle operations. The ISG 64 may also be configured to receiving torque from the engine 14 and operate as a generator. The ISG 64 may be selectively coupled to the engine by a clutch 66, belt 68, and a pair of pulleys 70. If the ISG 64 is coupled to the engine by a belt 68 it may be referred to as a belt integrated starter-generator (BISG). The controller 50 may be configured to transmit signals to the ISG 64 to operate the ISG 64 as either a motor or a generator. The controller may also be configured to transmit signals to the clutch 66 in order to open or close the clutch 66. The ISG 64 will be coupled to the engine 14 when the clutch is in a closed state and decoupled from the engine 14 when the clutch 66 is in an open state. The ISG 64 may be configured to provide electrical energy to charge the accessory battery 72, the traction battery 20, or provide electrical energy to power the vehicle accessories 62 when operating as a generator. The accessory battery 72 may also be configured to power the vehicle accessories 62.

Since the traction battery 20 is configured to propel the vehicle 10, the traction battery 20 will operate at a higher relative voltage than the accessory battery 72. Therefore, the traction battery 20 may be referred to a high voltage battery while the accessory battery 72 may be referred to as a low voltage battery.

The vehicle 10 may include a power takeoff 74 that is configured to transfer electrical power from the battery 20 and/or the M/G 18 to one or more external devices 76 that are connected to the power takeoff 74. More specifically, the power the takeoff 74 may be configured to transfer power from the battery 20 and/or the M/G 18 via the wiring 54 to the one or more external devices 76 that are connected to the power takeoff 74. The power takeoff 74 may comprise one or more electrical outlets that deliver power to the external devices 76 that are connected to the electrical outlets. The power takeoff 74 may also include inverting circuitry that converts the DC voltage of the wiring 54 to AC voltage which is then delivered to the one or more electrical outlets. The power electronics 56 and the wiring 54 may collectively be referred to as an electoral circuit. The external devices 76 may be any type of device that is configured to receive electrical power, such as power tools (e.g., saws or drills), lighting devices, air compressors, refrigeration systems, stoves, microwaves, cement mixers, etc. The system may be referred to as a "power to the box" feature or "onboard generator" that transfers electrical power from the battery 20 and/or M/G 18 to any external device.

Additionally, the M/G 18 may be configured to provide electrical power to the power takeoff 74 and any external device 76 that is connected to the power takeoff 74. The M/G 18 may also be connected to the power takeoff 74 through the power electronics 56. The controller 50 may be configured to control the amount of electric current that is being delivered from the M/G 18 and/or the battery 20 to the power takeoff 74.

The controller 50 may be configured to receive various states or conditions of the various vehicle components illustrated in FIG. 1 via electrical signals. The electrical signals may be delivered to the controller 50 from the various components via input channels. Additionally, the electrical signals received from the various components may be indicative of a request or a command to change or alter a state of one or more of the respective components of the vehicle 10. The controller 50 includes output channels that are configured to deliver requests or commands (via electrical signals) to the various vehicle components. The controller 50 includes control logic and/or algorithms that are configured to generate the requests or commands delivered through the output channels based on the requests, commands, conditions, or states of the various vehicle components.

The input channels and output channels are illustrated as dotted lines in FIG. 1. It should be understood that a single dotted line may be representative of both an input channel and an output channel into or out of a single element. Furthermore, an output channel into one element may operate as an input channel to another element and vice versa.

It should be understood that the schematic illustrated in FIG. 1 is merely representative and is not intended to be limiting. Other configurations are contemplated that utilize selective engagement of both an engine and a motor to transmit power through the transmission. For example, the M/G 18 may be offset from the crankshaft 28, and/or the M/G 18 may be provided between the torque converter 22 and the gearbox 24. Other configurations are contemplated without deviating from the scope of the present disclosure.

It should further be understood that the vehicle configuration described herein is merely exemplary and is not intended to be limited. Other electric or hybrid vehicle configurations should be construed as disclosed herein. Other electric or hybrid vehicle configurations may include, but are not limited to series hybrid vehicles, parallel hybrid vehicles, series-parallel hybrid vehicles, plug-in hybrid electric vehicles (PHEVs), fuel cell hybrid vehicles, battery electric vehicles (BEVs) or any other electric or hybrid vehicle configuration known to a person of ordinary skill in the art.

Figure 2:
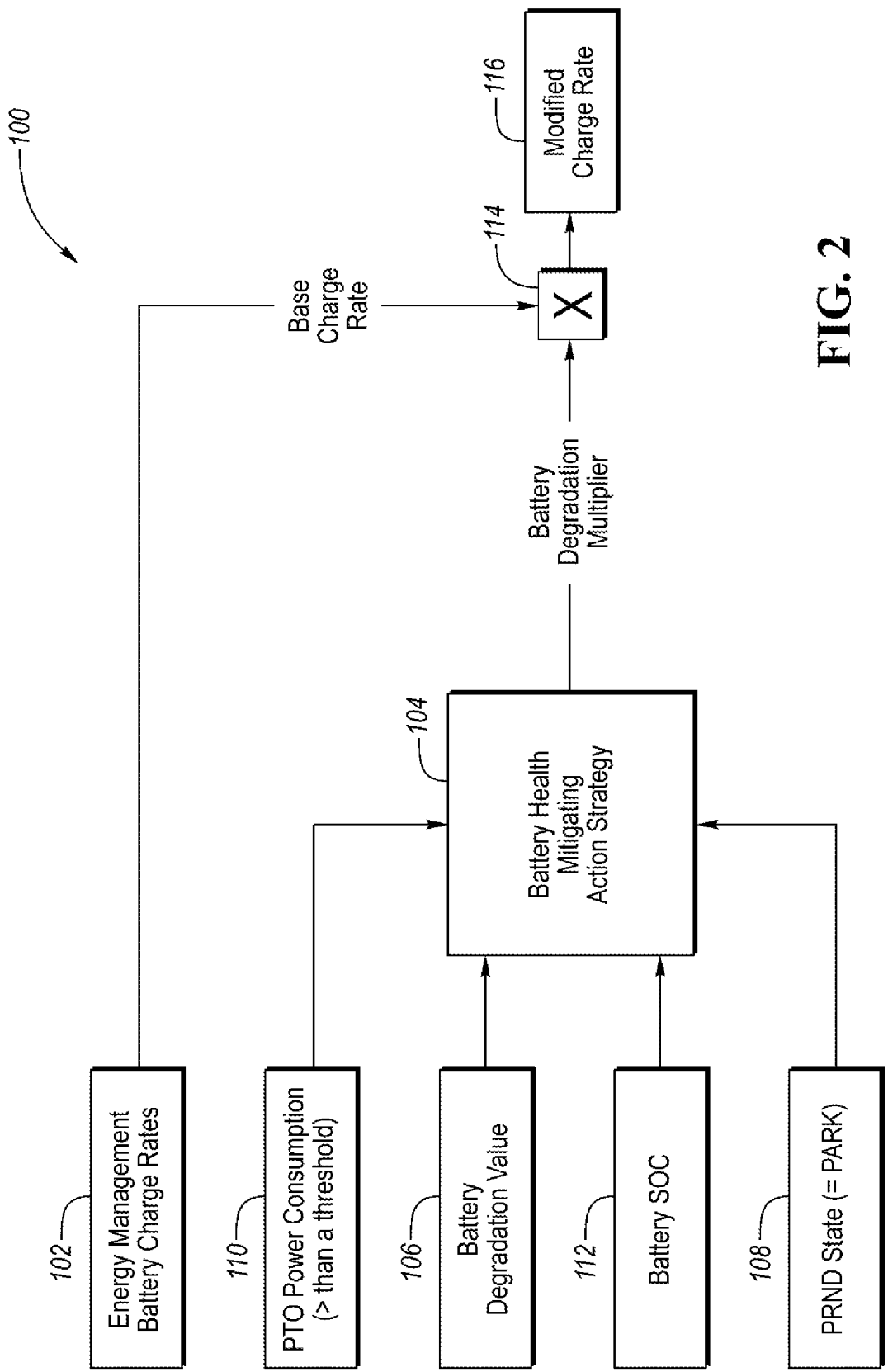
FIG. 2 is a flowchart of a method for recharging a battery in a hybrid or electric vehicle.

Referring to FIG. 2, a method 100 for recharging the battery 20 in the vehicle 10 is illustrated. The method 100 may be stored as control logic and/or an algorithm within the controller 50. The controller 50 may implement the method 100 by controlling the various components of the vehicle 10. The method 100 may be initiated by turning a start key or ignition of the vehicle 10 to an "on" position.

Battery charge rates 102 are stored within the controller 50 and may be a function of the torque or power that is being utilized to operate the M/G 18 to generate the electricity that is used to charge the battery 20. The torque or power that is being utilized to operate the M/G 18 to generate the electricity that is used to charge the battery 20 may more specifically be the torque or power of the engine 14. The battery charge rates 102 may be power values that are stored in tables within the controller 50 relative to corresponding torque or power values to operate the M/G 18 to generate the electricity to charge the battery 20. A desired battery charge rate may be generated and pulled from the battery charge rates 102 in response to a command to charge the battery 20, which may be generated when the state of charge of the battery 20 decreases to less than a threshold.

The method 100 includes a battery health mitigation strategy 104. The purpose of the battery health mitigation strategy 104 is to reduce usage of the battery 20 to increase the life of the battery 20 and to slow degradation of the battery 20 once it is determined that battery degradation may have been accelerated, which may be caused by excess use of the onboard generator feature (i.e., excess use of utilizing the one or more electrical outlets of the power takeoff 74 to power external devices 76).

A health metric or degradation value 106 of the battery 20 may refer to a decrease in the overall energy storage capacity of the battery 20 or a decrease in the capability or capacity of the battery 20 to charge and discharge (e.g., decreases in maximum rates at which the battery 20 charges and discharges energy, i.e., power). The degradation value 106 of the battery may be a function of parameters such as decreases in the open circuit voltage of the battery 20 or increases in the internal resistance of the battery 20. The degradation value 106 of the battery 20 may be stored in tables within the controller 50 relative to corresponding decreases in the open circuit voltage of the battery 20 or increases in the internal resistance of the battery 20. Battery degradation may be caused by changes in battery temperature that occurs during charging and discharging.

The health mitigation strategy 104 is configured to increase the life of the battery 20 and to slow degradation of the battery 20 by adjusting a rate at which the M/G 18 charges the battery 20. More specifically, the health mitigation strategy 104 is configured to decrease the rate at which the M/G 18 charges the battery 20 from a base rate to an adjusted rate as the degradation value 106 increases. It should be noted that increases in the degradation value 106 may correspond to decreases in the open circuit voltage of the battery 20 or increases in the internal resistance of the battery 20. The base rate may be the desired battery charge rate generated and pulled from the battery charge rates 102 in response to a command to charge the battery 20, which may be generated when the state of charge of the battery 20 decreases to less than a threshold. Adjustments to the rate at which the M/G 18 charges the battery 20 may be increased or decreased by increasing or decreasing, respectively, the torque or power output of the engine 14, which is delivers power to the M/G 18.

The health mitigation strategy 104 may be implemented when certain conditions are present. For example, the health mitigation strategy 104 may be configured to decrease the rate at which the M/G 18 charges the battery 20 as the degradation value 106 increases when the transmission or gearbox 24 is in a parked state (e.g., when the transmission range or gear selector 25 has been shifted into the parked gear) as illustrated by block 108 and when the power consumption of the power takeoff 74 is greater than a threshold as illustrated by block 110 (e.g., when the power being delivered to the one or more outlets of the power takeoff 74 to power the external devices 76 is greater than a threshold).

The health mitigation strategy 104 may also take into account the current state of charge of the battery 20. For example, the health mitigation strategy 104 may further decrease the rate at which the M/G 18 charges the battery 20 as the state of charge of the battery 20 increases or may further increase the rate at which the M/G 18 charges the battery 20 as the state of charge of the battery 20 decreases.

The output of the health mitigation strategy 104 is a battery degradation multiplier, which may also be referred to a degradation coefficient or charge modification value. The battery degradation multiplier is then multiplied by the base charge rate (i.e., the desired battery charge rate generated and pulled from the battery charge rates 102 in response to the command to charge the battery 20) at multiplier block 114, which outputs a modified charge rate 116 for the battery 20. The modified charge rate 116 is then utilized to charge the battery 20 in response to the command to charge the battery 20. The battery degradation multiplier is less than or equal to one. The battery degradation multiplier is function of the battery degradation values 106 and the battery state of charge. The battery degradation multiplier may be stored in tables within the controller 50 relative to corresponding degradation values 106 and battery state of charge values. More specifically, the battery degradation multiplier is configured to decrease as the battery degradation value 106 increases and may be proportional to increases in the battery degradation value 106.

In the event that either of the conditions in blocks 108 or 110 are not present (i.e., if the transmission or gearbox 24 is not in the parked state or if the power being delivered to the one or more outlets of the power takeoff 74 is not greater than the threshold), the base charge rate (i.e., the desired battery charge rate generated and pulled from the battery charge rates 102 in response to the command to charge the battery 20) may be utilized to charge the battery 20 in response to the command to charge the battery 20. More specifically, under such a circumstance, the battery degradation multiplier may default to a value of one such that the health mitigation strategy 104 has no effect on the charging rate of the battery 20, which is equates to overriding the health mitigation strategy 104 and simply charging the battery 20 according to the base charge rate.

Figure 3:
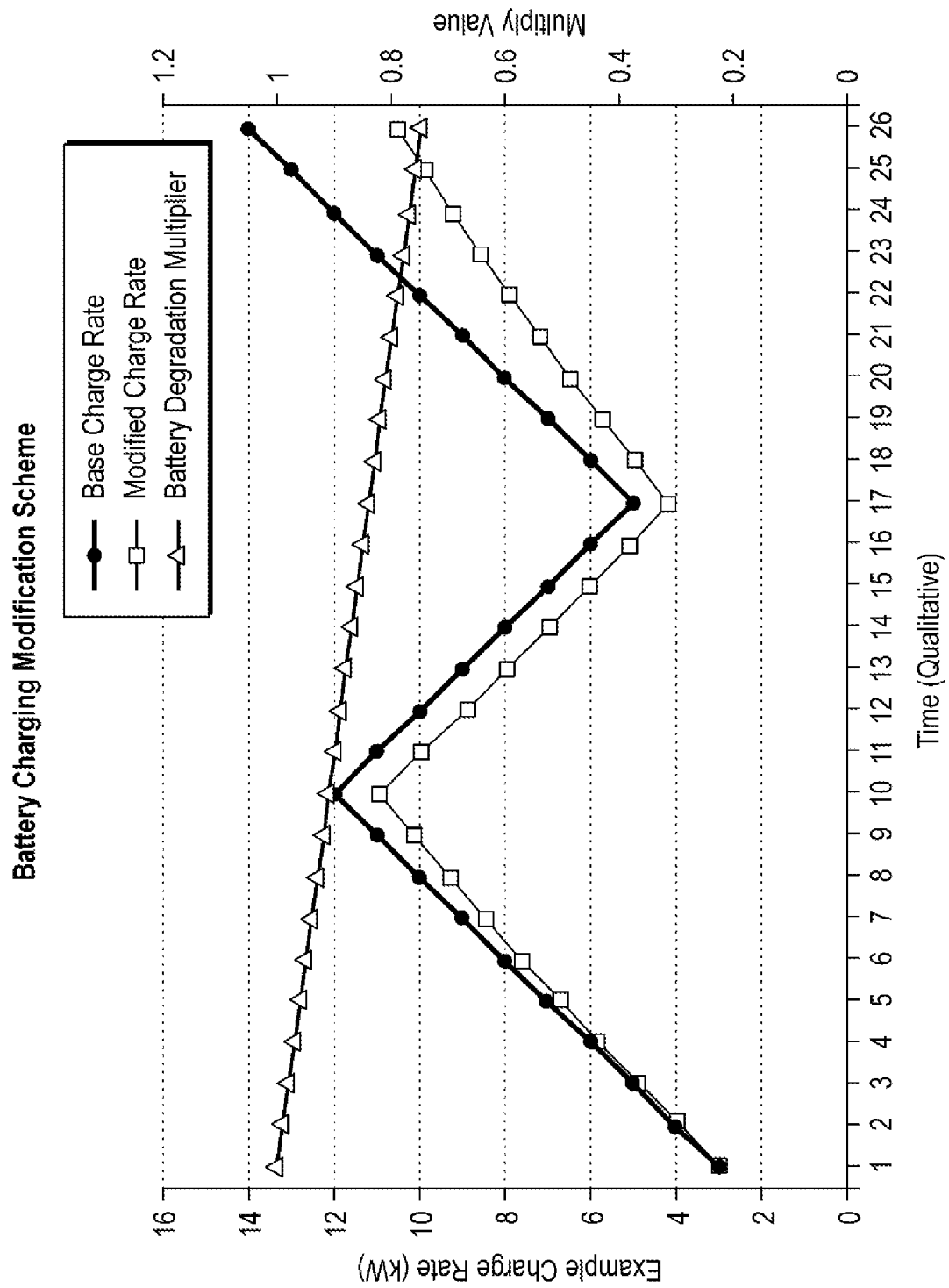
FIG. 3 is a series of graphs illustrating modifications to the charging rate of the battery per the method of FIG. 2.

An example of the relationship between the base charge rate, the battery degradation multiplier, and the modified charge rate 116 are illustrated in FIG. 3. In all instances, the modified charge rate 116 is less than the base charge rate. FIG. 3 further illustrates that as the battery degradation multiplier decreases over time the difference between the base charge rate and the modified charge rate 116 further increases.

An alternative strategy could be achieved by having a scheme to start the engine 14 earlier to power the M/G 18 to power any electrical loads as opposed to utilizing the battery 20 to power any electrical loads, including the loads on the power takeoff 74. This may be referred to as a "load follow strategy."

It should be understood that the flowchart in FIG. 2 is for illustrative purposes only and that the method 100 should not be construed as limited to the flowchart in FIG. 2. Some of the steps of the method 100 may be rearranged while others may be omitted entirely. It should be understood that the designations of first, second, third, fourth, etc. for any component, state, or condition described herein may be rearranged in the claims so that they are in chronological order with respect to the claims.

The words used in the specification are words of description rather than limitation, and it is understood that various changes may be made without departing from the spirit and scope of the disclosure. As previously described, the features of various embodiments may be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. As such, embodiments described as less desirable than other embodiments or prior art implementations with respect to one or more characteristics are not outside the scope of the disclosure and may be desirable for particular applications.

What is claimed is:
1. A vehicle comprising:
a battery;
an electric machine configured to charge the battery;
an electrical outlet configured to draw power from the battery to power an external device; and
a controller programmed to
decrease a rate at which the electric machine charges the battery based on a power consumption at the electrical outlet exceeding a threshold, wherein the rate is decreased from a base value,
decrease the rate from the base value based on a battery degradation value, and in response to the power consumption at the electrical outlet being less than the threshold, override decreasing the rate according to the battery degradation value and adjust the rate to the base value.

2. The vehicle of claim 1, wherein the battery degradation value is indicative of a decrease in an energy storage capacity of the battery.

3. The vehicle of claim 1, wherein the controller is programmed to, in response to increases in the battery degradation value, further decrease the rate.

4. The vehicle of claim 3, wherein the decrease in the rate according to the battery degradation value corresponds to a product of the base value of the rate and a degradation multiplier.

5. The vehicle of claim 4, wherein the degradation multiplier is less than or equal to one, and wherein the degradation multiplier decreases as the battery degradation value increases.

6. The vehicle of claim 1 further comprising an engine configured to power the electric machine to charge the battery.

7. The vehicle of claim 6, wherein the controller is programmed to adjust a power output of the engine to adjust the rate.

8. The vehicle of claim 6, wherein the controller is programmed to adjust a torque output of the engine to adjust the rate.

9. The vehicle of claim 1, wherein the battery degradation value is indicative of decreases in maximum energy charging and discharging capabilities of the battery.

10. The vehicle of claim 1 further comprising a transmission, and wherein the controller is programmed to, in response to the transmission not being in a parked gear, override decreasing the rate according to the battery degradation value and adjust the rate to the base value.

11. A vehicle comprising:
a battery;
an electric machine configured to propel the vehicle and to charge the battery;
an electrical circuit configured to transfer power between the battery and the electric machine;
an electrical outlet configured to draw power from the battery via the electrical circuit; and
a controller programmed to,
in response to a battery charge decreasing to less than a charge threshold, issue a command to charge the battery,
in response to the command to charge the battery, a power consumption at the electrical outlet exceeding a consumption threshold, and a battery degradation value, decrease a rate at which the electric machine charges the battery from a base value to an adjusted value, wherein decreasing the rate from the base value is based on the battery degradation value, and
in response to the power consumption at the electrical outlet being less than the threshold, override decreasing the rate according to the battery degradation value and adjust the rate to the base value.

12. The vehicle of claim 11, wherein the adjusted value corresponds to a product of the base value of the rate and a degradation multiplier.

13. The vehicle of claim 12, wherein the degradation multiplier is less than or equal to one, and wherein the degradation multiplier decreases as the decrease in the energy storage capacity of the battery increases.

14. The vehicle of claim 11 further comprising a transmission, and wherein the controller is programmed to, in response to the transmission not being in a parked gear and the parameter values indicative of the decrease in an energy storage capacity of the battery, adjust the rate to the base value.

15. A vehicle comprising:
a battery;
an electric machine configured to charge the battery;
an engine configured to power the electric machine to charge the battery;
an electrical outlet configured to draw power from the battery to power an external device; and
a controller programmed to,
in response to a power consumption at the electrical outlet exceeding a threshold, adjust a power output of the engine to decrease a rate at which the electric machine charges the battery, wherein the rate is decreased from a base value,
in response to a battery degradation value, adjust the power output of the engine to decrease the rate from the base value, and
in response to the power consumption at the electrical outlet being less than the threshold, override decreasing the rate according to the battery degradation value and control the power output of the engine to adjust the rate to the base value.

16. The vehicle of claim 15, wherein the battery degradation value corresponds to an increase in an internal resistance of the battery.

17. The vehicle of claim 15, wherein the controller is programmed to, in response to increases in the battery degradation value, further decrease the rate.

18. The vehicle of claim 17, wherein the decrease in the rate according to the battery degradation value corresponds to a product of the base value of the rate and a degradation multiplier.

19. The vehicle of claim 18, wherein the degradation multiplier is less than or equal to one, and wherein the degradation multiplier decreases as the battery degradation value increases.

20. The vehicle of claim 17 further comprising a transmission, and wherein the controller is programmed to control the power output of the engine to adjust the rate to the base value in response to the increases in the battery degradation value and the transmission not being in a parked gear.

* * * * *